United States Patent [19]

Sato et al.

[11] 4,167,704

[45] Sep. 11, 1979

[54] CHANNEL SELECTING APPARATUS

[75] Inventors: Masaru Sato, Asaka; Takahiko Saito, Kamakura, both of Japan

[73] Assignee: Sony Corporation, Tokyo, Japan

[21] Appl. No.: 912,080

[22] Filed: Jun. 5, 1978

[30] Foreign Application Priority Data

Jun. 6, 1977 [JP] Japan .................. 52-66417

[51] Int. Cl.$^2$ ............................................. H04B 1/26
[52] U.S. Cl. ............................... 325/457; 179/100.11; 325/464; 358/191; 360/33
[58] Field of Search ............... 358/191; 325/457, 464, 325/465, 311, 25, 459; 179/100.11; 360/33, 137; 331/46, 48, 55, 56

[56] References Cited

U.S. PATENT DOCUMENTS 3,699,359  10/1972  Shelby .................................... 325/465
4,031,334  6/1977   Kimura et al. ...................... 179/100.11

Primary Examiner—Marc E. Bookbinder
Attorney, Agent, or Firm—Lewis H. Eslinger; Alvin Sinderbrand

[57] ABSTRACT

Channel selecting apparatus for use with first and second electrically tunable tuning devices. A selectively operable channel selector, common to the first and second tuning devices, generates and supplies channel selector signals to the first and second tuning devices to determine the tuning conditon of both devices. A control circuit selectively produces a lock-out control signal; and a locking circuit is coupled to the second tuning device and is responsive to the absence of the lock-out control signal to enable the tuning condition of the second tuning device to be determined by the channel selector signals at the same time that the tuning condition of the first tuning device is determined by the channel selector signals; the locking circuit being responsive to the presence of the lock-out control signal to lock the second tuning device to the tuning condition which was determined by the channel selector signal generated immediately prior to the lock-out control signal, regardless of the subsequent generation of different channel selector signals.

One advantageous applicaton of the channel selecting apparatus is with a common channel selector for use with a television receiver and with a VTR, wherein it is necessary to prevent the broadcast channel to which the VTR is tuned from being changed during a recording operation, even though the television receiver can be tuned to any other different broadcast channel.

15 Claims, 2 Drawing Figures

CHANNEL SELECTING APPARATUS

BACKGROUND OF THE INVENTION

This invention relates to channel selecting apparatus for use with two tuning devices and, more particularly, to channel selecting apparatus which is provided with a common channel selector by which the two tuning devices can be tuned to the same channel at the same time, but is further operable to lock the tuning condition of one of the tuning devices while enabling the channel selector to be operated so that the tuning condition of the other tuning device can be changed, as desired, without affecting the locked tuning condition of the first-mentioned tuning device.

In some applications, it is desirable to provide two different tuners which are capable of being operated independently of each other to receive different broadcast frequencies. For example, in the signal recording art, one tuning device may be provided in a signal receiver so that a user can perceive signal information which is received thereby, and another tuning device may be provided in a signal recorder so that, while the user perceives that signal information, such information also can be recorded. Of course, if two different tuning devices are provided, that is, one tuning device is provided for signal reception so that the information can be reproduced and the other tuning device is provided for signal recording, the user may wish to record signal information which is received via one channel while perceiving information which is received via a different channel.

One example of the foregoing is found in video tape recorders (VTR's) which are used with television receivers. Thus, the user may wish to view one television program on the television receiver while a different television program is recorded by the VTR. Since the television receiver and the VTR both include separate, independent tuners, it is not necessary that both devices be tuned to the same channel to enable a proper video recording operation. However, while the tuner included in the television receiver can be changed as desired, it is necessary that the tuner in the VTR be locked to the channel which is being recorded throughout the duration of a recording operation. If the tuning condition of the tuner in the VTR is changed while video signals are being recorded, either deliberately or unintentionally, the recorded signals will be distorted. Furthermore, unintentional adjustments to the tuning condition of the tuner in the VTR may result in the recording of an unwanted program.

In order to facilitate a change in the tuning condition of the tuner in the television receiver, while preventing a concurrent change in the tuning condition of the VTR, separate channel selectors generally are provided for both devices. Even when the television receiver and VTR are combined in a common housing, or cabinet, a separate channel selector is provided for the television receiver, and another separate channel selector is provided for the VTR. The user may, therefore, select a particular channel for recording by the VTR by operating the VTR channel selector, and then may monitor that program being recorded or may view any other channel by operating the channel selector of the television receiver. The use of such two different channel selectors is believed to reduce substantially the possibility of a user unintentionally changing the tuning condition of the VTR during a recording operation.

With the advent of electronic tuners, many of the disadvantages of prior art electromechanical tuners have been avoided. An electronic tuner generally may include a variable reactance device, such as a varactor, whose reactance is determined by a control voltage applied thereto. The reactance of the variable reactance device establishes the tuning condition of the electronic tuner, and thus the particular channel to which the tuner is tuned. In some electronic tuners, the control voltage which is applied to the variable reactance device is produced in response to the manual operation of channel selector switches, such as locking, non-locking or touch-sensitive switches. When used in television receivers, the electronic tuner of the aforedescribed type is simple to operate, enables virtually any channel to be selected rapidly, and exhibits a high longevity while requiring little or no maintenance. The typical electromechanical tuner which is replaced by this electronic tuner includes many contacts and detents which may oxidize and which, over prolonged usage, may become worn, thereby degrading the tuning condition. Furthermore, the electromechanical tuner often is difficult to operate. Also, the electromechanical tuner cannot be used to select arbitrary channels directly. Rather, channels must be selected in sequence until a desired channel is obtained.

The relative difficulty is operating the electromechanical tuner has one advantage when used as the tuner in a VTR. That is, there is a lesser probability that the electromechanical tuner will be operated to change the tuning condition of the tuner during a recording operation. For this reason, most VTR's generally are provided with an electromechanical tuner and not with an electronic tuner.

Nevertheless, the use of separate channel selectors in the television receiver and in the VTR is a duplication of parts. Although separate tuning devices are necessary in order to permit different channels to be recorded and to be viewed, the requirement heretofore of redundant channel selectors has added to the cost of manufacture and assembly of television receivers and VTR's. This is particularly so when the television receiver and VTR are combined in a single housing or cabinet. However, it has been thought heretofore that separate channel selectors still are necessary in order to prevent a change in the tuning condition of the VTR during a recording operation, while permitting the tuning condition of the television receiver to be changed as desired. It also has been thought that, in general, a user of the VTR may select a particular channel for recording without wishing to monitor that channel on the television receiver. This is achieved by operating the channel selector of the VTR to the desired channel for recording, while operating the channel selector for the television receiver to select any other desired channel for viewing. It is believed, however, that a user will, in practically all instances, monitor, at least preliminarily, the channel which is selected for recording.

Therefore, there is a need for providing a single channel selector which is common both to the tuner of a television receiver and to the tuner of a VTR, thereby minimizing the number of parts in the channel selecting apparatus, and thus reducing costs. Furthermore, if a common channel selector is provided for both tuning devices, there is an additional need that, although both tuners may have their tuning conditions adjusted simultaneously, the tuner of the VTR must be locked to a selected channel during a recording operation, even though the tuning condition of the television receiver might be changed.

OBJECTS OF THE INVENTION

Therefore, it is an object of the present invention to provide improved channel selecting apparatus which can be used to control two tuning devices.

Another object of this invention is to provide improved channel selecting apparatus for use with two electrically tunable tuning devices, and wherein a single channel selector is common to both tuning devices.

A further object of this invention is to provide channel selecting apparatus for use with two electrically tunable tuning devices and including a common channel selector for both devices, wherein the channel selector is operable to change the tuning conditions of both tuning devices at the same time, but one of the tuning devices can be selectively locked to a desired channel, and thus be non-responsive to the operation of the channel selector, while the other tuning device can have its tuning condition changed by the channel selector.

An additional object of this invention is to provide channel selecting apparatus for use with a television receiver and a VTR, and including a single channel selector which is common to the tuners included in the television receiver and in the VTR, and wherein the tuner in the VTR can be locked to a selected channel during a recording operation while, at the same time, the tuner in the television receiver can be changed as desired.

Yet another object of this invention is to provide channel selecting apparatus for use with a television receiver and a VTR wherein the tuners in both the television receiver and the VTR are electrically tunable tuners, and wherein a channel selector, common to both tuners, is of the selector-switch type formed of push-button switches, locking switches, non-locking switches, touch-sensitive switches, or the like.

A still further object of this invention is to provide channel selecting apparatus for use with two electrically tunable tuners, and wherein both tuners are provided with channel indicators which are selectively switched in response to a manually operable channel selector that is common to both tuners, and wherein one of the tuners can be locked to remain tuned to an indicated channel notwithstanding operation of the channel selector, while the other tuner is free to be tuned to any desired channel.

Various other objects, advantages and features of the present invention will become readily apparent from the ensuing detailed description, and the novel features will be particularly pointed out in the appended claims.

SUMMARY OF THE INVENTION

In accordance with this invention, channel selecting apparatus is provided for use with first and second electrically tunable tuning devices, the channel selecting apparatus being operable to tune the tuning devices to preselected channels. A selectively operable channel selector, common to the first and second tuning devices, generates and supplies channel selector signals to the first and second tuning devices so as to determine the tuning conditions of both devices. A control circuit selectively produces a lock-out control signal which is used to lock one of the tuning devices to the tuning condition determined by the channel selector signal which was generated immediately prior to the production of the lock-out control signal, regardless of the generation of different channel selector signals by the channel selector, while the other tuning device can be tuned, by such channel selector signals, to any other desired channel. In the absence of the lock-out signal, the tuning conditions of both tuning devices are determined at the same time by the selectively produced channel selector signals.

In one advantageous application of this invention, one electrically tunable tuning device is provided in a television receiver and the other tuning device is provided in a VTR. Both tuning devices are tuned simultaneously by the particular channel selector signal which is produced. When a recording operation is performed, the tuner in the VTR is locked to the channel which had been selected for recording, even though the channel selector may be operated to produce different channel selector signals. Nevertheless, the tuner in the television receiver is responsive to such different channel selector signals to change the channel to which it is tuned. In this application, a set of channel indicators is provided for the VTR to indicate the particular channel to which the tuner in the VTR is tuned, and a separate set of channel indicators is provided for the television receiver to indicate the particular channel to which the television receiver is tuned.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

In the following description of the present invention, it is assumed that the channel selecting apparatus is provided in the environment of a television receiver and a video tape recorder (VTR), both the television receiver and the VTR including separate tuners. However, it will be appreciated that this invention can be used with an audio receiver and an audio recorder, as well as with various other types of signal receivers and tuners. It is not necessary that one of the tuners be provided in a signal recorder. Rather, both tuners, as will be described, can be included in signal receivers, such as video receivers, line-transmission receivers, and the like. Nevertheless, since a distinct advantage is achieved by using this invention with a television receiver and a television recorder, such an environment is disclosed.

Figure 1:
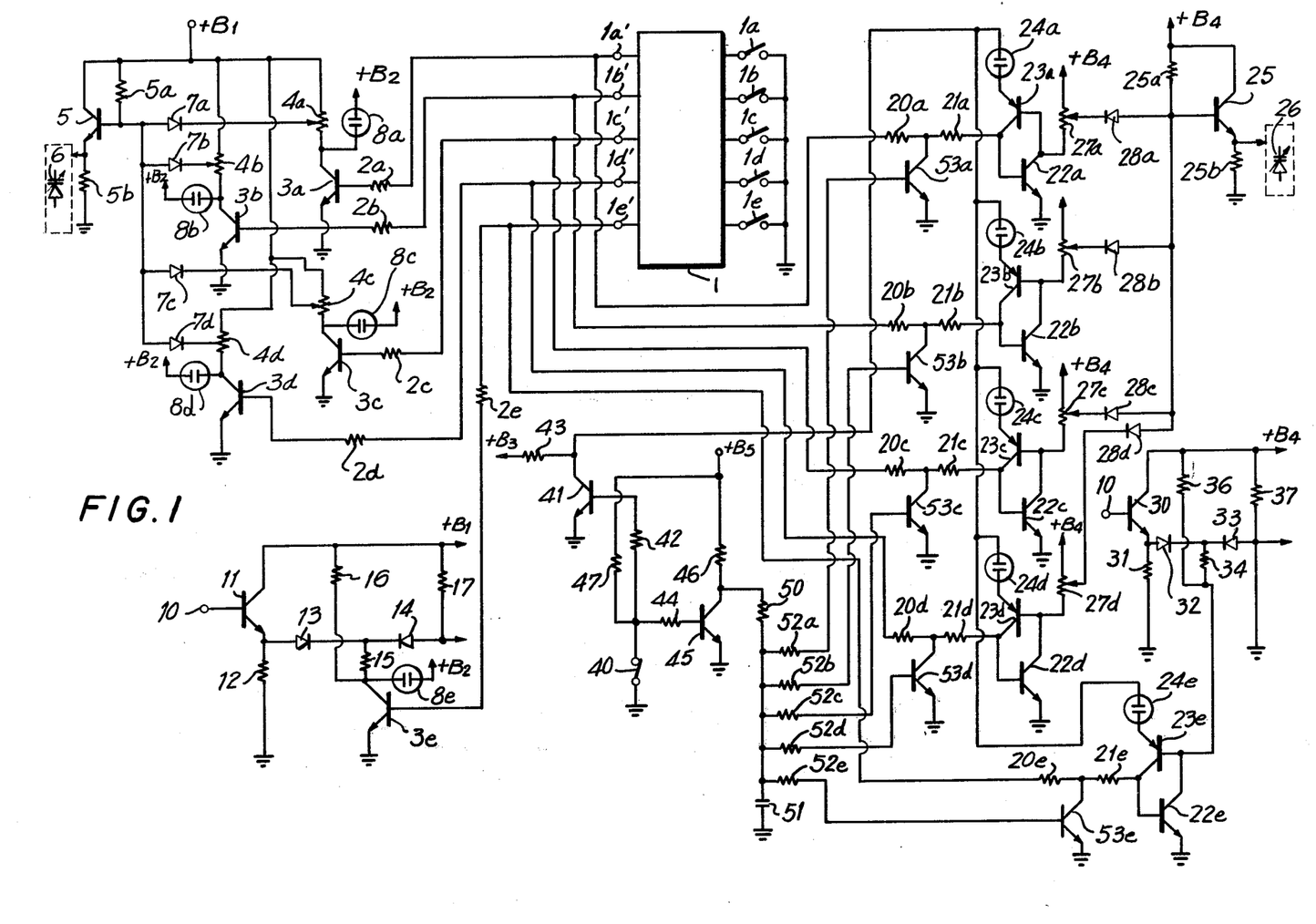
FIG. 1 is a schematic diagram of one embodiment of the present invention.

The channel selecting apparatus includes a channel selector, shown herein as a plurality of channel selecting switches 1a–1e, in combination with a memory device 1, and two separate electrically tunable tuning devices, each tuning device including a variable reactance device, such as a varactor 6 and a varactor 26, respectively. It will be assumed, for the purpose of the present discussion, that variable reactance device 6 is included in a television receiver, and will be designated as part of the television tuner, and that variable reactance device 26 is included in a VTR, and is part of the VTR tuner. The television tuner additionally includes a plurality of transistor switches 3a–3d, each being selectively energized to apply a distinct control voltage to variable reactance device 6, and an additional switching transistor 3e which, when energized, enables the television receiver to receive a video signal supplied directly from an auxiliarly device, such as a video camera, or the playback circuit of another VTR. Similarly, the VTR tuner includes a plurality of switching circuits, each being selectively energized to produce a distinct control voltage which is applied to variable reactance device 26 for correspondingly tuning the VTR tuner to a selected channel. These switching circuits include switching transistors 22a–22d and additional transistors 23a–23d, respectively. A further switching transistor 22e and a further additional transistor 23e are provided to be energized when the VTR is to record a video signal supplied thereto from an auxiliary device, such as a video camera or the playback circuit of another VTR.

Each of switches 1a–1e is associated with a respective channel, for example, a broadcast channel, an auxiliary channel, or the like, and each may be formed as a push-button switch, a locking switch, a non-locking switch, a touch-sensitive switch, or the like. For example, switch 1a may be associated with channel 2 such that when this switch is operated, the reactance of variable reactance devices 6 and 26 is adjusted such that the television and VTR tuners and tuned to the broadcast frequency corresponding to channel 2. Similarly, switch 1b may be associated with channel 3, switch 1c may be associated with channel 4, and so on. Although only five switches are shown in FIG. 1, it is contemplated that, in many embodiments, a much larger number of switches will be provided so that the television receiver and VTR can be tuned to receive the twelve separate VHF channels and many of the eighty-four separate UHF channels which now are available in the United States. Furthermore, successive switches need not be associated with successive channels. Rather, each switch may be associated with any available channel in accordance with a viewer's preference. Thus, switch 1a may be associated with channel 5, switch 1b may be associated with channel 2, and the like.

Each of switches 1a–1e has one terminal thereof connected to a reference potential, such as ground, and the other terminal thereof coupled to a respective input of memory circuit 1. Thus, when a switch is operated, or closed, ground potential is applied to the corresponding input of memory circuit 1. The memory circuit is adapted to detect which of switches 1a–1e is operated and to provide an output voltage at an output terminal thereof 1a'–1e', corresponding to the operated switch. Each output terminal 1a'–1e' of the memory circuit is associated with a respective channel to which the television receiver and VTR can be tuned. For example, output terminal 1a' may be associated with channel 2, such that an output signal, referred to hereinafter as a channel selector signal, is provided thereat when the switch corresponding to this channel is operated. Memory circuit 1, which also may include suitable gating circuitry, obviates the requirement that switches 1a–1e must be of the locking type and, furthermore, enables the selective "programming" of these switches such that any arbitrary switch may be designated by the user to be associated with a particular channel. Thus, and in accordance with the foregoing example, a channel selector signal corresponding to channel 2 may be associated at output terminal 1a' depending upon which switch has been "programmed" to select this channel.

Of course, switches 1a–1e may be associated with output terminals 1a–1e', respectively, such that the operation of one switch results in a channel selector signal appearing at the associated output terminal. This simplifies the construction of memory circuit 1 which, in such an embodiment, may include a respective storage circuit, such as a flip-flop circuit, connected to an associated switch and being adapted to be set when its associated switch is operated and to be reset when any of the remaining switches is operated.

Output terminals 1a'–1e' of memory circuit 1 are connected to the base electrodes of transistors 3a–3e by base resistors 2a–2e, respectively. Each transistor, shown herein as an npn transistor, has its emitter connected to a reference potential, such as ground, and its collector connected to a source of operating voltage $+B_1$ via a collector resistor. In particular, resistors 4a–4d couple the collectors of transistors 3a–3d to this source of operating potential, and resistor 16 couples the collector of transistors 3e to source $+B_1$. Each of resistors 4a–4d is an adjustable resistor, such as a potentiometer, whose tap is adjustable to produce a distinct output voltage when the transistor to which the potentiometer is connected is conductive. Thus, when transistor 3a is conductive, for example, the output voltage provided at the tap of potentiometer 4a differs from the voltages which are provided at the output taps of potentiometers 4b–4d when one of transistors 3b–3d is conductive. Similarly, the output voltage produced at the output tap of potentiometer 4b is distinct from the voltages which are produced at the output taps of potentiometers 4a, 4c and 4d, and so on.

The output taps of potentiometers 4a–4d are connected via diodes 7a–7d, respectively, to a common junction. Depending upon which of transistors 3a–3d is conducting, the voltage which is provided at the common junction of diodes 7a–7d is of a distinct level corresponding to a channel which is selected by one of switches 1a–1d. This common junction is connected to the base electrode of emitter-follower transistor 5 whose emitter electrode is coupled to variable reactance device 6 so as to supply a voltage level thereto, corresponding to the channel which has been selected. The reactance of variable reactance device 6 is adjusted in accordance with this voltage level so as to correspondingly tune the television receiver to the selected channel. As shown, the emitter of transistor 5 is coupled to an emitter load resistor 5b, and the base of this transistor is coupled to source $+B_1$ by a bias resistor 5a.

The collectors of transistors 3a–3e are additionally coupled to another source of operating potential $+B_2$ via indicators 8a–8e, respectively. Each indicator may comprise a gas discharge tube or other light source which is energized when current flows therethrough.

As shown in FIG. 1, transistor 3a is not used to generate a voltage level for controlling the reactance of variable reactance device 6. Rather, transistor 3e is coupled to a gating circuit comprised of an emitter-follower transistor 11 and diodes 13 and 14, and is used for selectively gating a video signal to the television receiver. The collector of transistor 3e is coupled via a resistor 15 to the junction defined by the common-connected cathodes of diodes 13 and 14. These diodes are connected in series from the emitter of transistor 11 to an output terminal of the gating circuit. The anode of diode 14 is coupled to source $+B_1$ by a bias resistor 17. Emitter-follower transistor 11 has its base connected to an input terminal 10 to receive a video signal and its emitter connected to ground by an emitter load resistor 12.

When transistor 3e is non-conductive, a relatively high potential is supplied to its collector from source $B_1$ through resistor 16. This potential prevents an energizing current from flowing through indicator 8e. Hence, this indicator is extinguished. At the same time, the relatively high potential at the collector of transistor 3e serves to reverse bias diodes 13 and 14. Consequently, even if a video signal is supplied to input terminal 10, the reverse biasing of diodes 13 and 14 prevents this video signal from being transmitted to the output terminal of the gate circuit. However, if transistor 3e is conductive, for example, if a channel selector signal is applied to output terminal 1e' of memory circuit 1, then the collector voltage of this transistor is reduced approximately to ground potential, thereby enabling current to flow through indicator 8e. Hence, this indicator is energized to indicate to the viewer that the corresponding channel has been selected. Furthermore, the reduction in the collector voltage of transistor 3e tends to forward bias both diode 13 and diode 14. This means than an input video signal which is applied to input terminal 10 is transmitted from the emitter electrode of emitter-follower transistor 11 through forward-biased diodes 13 and 14 to the output terminal of the gate circuit. Thus, this video signal, which may be produced by an auxiliary video camera, or by the playback circuit of another VTR, will be viewed on a television receiver.

Turning now to the VTR tuner, the base electrodes of transistors 22a–22e are coupled to output terminals 1a'–1e', respectively, via separate conducting paths, each conducting path including a pair of series-connected resistors. Thus, output terminal 1a' is coupled via resistors 20a and 21a to transistor 22a. Similarly, output terminal 1b' is coupled via resistors 20b and 21b to transistor 22b. A similar arrangement extends between the remaining output electrodes of memory circuit 1 and transistors 22c–22e. The collectors of transistors 22a–22d are coupled to another source of operating potential $+B_4$ via collector resistors 27a–27d, respectively. As shown, each of these collector resistors is an adjustable resistor, such as a potentiometer, whose output tap is adjustable to produce a distinct output voltage depending upon the positioning of the tap. In this regard, potentiometers 27a–27d are similar to aforedescribed potentiometers 4a–4d. The output taps of potentiometers 27a–27d are connected to a common junction via diodes 28a–28d, respectively. This junction is connected to the base of an emitter-follower transistor 25 whose emitter is connected to variable reactance device 26. A base bias resistor 25a couples the base of transistor 25 to source $+B_4$, and an emitter load resistor 25b couples the emitter of this transistor to ground. As may be appreciated, depending upon which of transistors 22a–22d is conductive, a corresponding voltage of distinct level is produced at the output tap of the adjustable resistor which is connected to the conducting transistor, and this distinct voltage level is applied to emitter-follower transistor 25. The emitter-follower transistor supplies a corresponding control voltage to variable reactance device 26, thus establishing the reactance of the variable reactance device so as to tune the VTR to the channel which has been selected.

Transistor 22e has its collector coupled to source $+B_4$ by a collector resistor 36. In addition, the collector of this transistor is connected via a resistor 34 to a gating circuit comprised of emitter-follower transistor 30 and diodes 32 and 33. It may be appreciated that emitter-follower transistor 30 and diodes 32 and 33 are similar to the aforedescribed gating circuit formed of emitter-follower transistor 11 and diodes 13 and 14. The base of emitter-follower transistor 30 is coupled to input terminal 10 for receiving a video signal which is produced by an auxiliary device, such as an auxiliary video camera, the playback circuit of another VTR, or the like. It is seen that when transistor 22e is non-conductive, diodes 32 and 33 are reverse biased so as to prevent the video signal which is applied to input terminal 10 of emitter-follower transistor 30 from being coupled to the output terminal of this gating circuit. However, when transistor 22e is conductive, diodes 32 and 33 both are forward biased so as to gate the video signal which is applied to emitter-follower transistor 30 to the output terminal of the gating circuit. Thus, when transistor 22e is conductive, the auxiliary video signal which is applied to input terminal 10 can be recorded by the VTR.

Transistors 22a–22e, which are npn transistors, are connected to transistors 23a–23e, respectively, in thyristor configuration. That is, transistors 23a–23e are pnp transistors having the collectors thereof connected to the bases of transistors 22a–22e and the bases thereof connected to the collectors of transistors 22a–22e, respectively. As is known, when a pnp transistor and an npn transistor are interconnected in this thyristor configuration, once the npn transistor is rendered conductive, or turned ON, it will remain conductive once the pnp transistor is turned ON, even if the original signal which is used to turn the npn transistor ON is removed. The emitter electrode of each of pnp transistors 23a–23e is connected to a source of operating potential via a light source 24a–24e, respectively. These light sources may be similar to aforedescribed light sources 8a–8e.

A transistor 41, whose base is connected to a source of operating potential $+B_5$ via series-connected resistors 42 and 47, has its emitter connected to ground and its collector connected to a source of operating potential $+B_3$ via a collector resistor 43. The collector of this transistor additionally is used as the aforementioned source of operating potential which is supplied through light sources 24a–24e to the emitters of pnp transistors 23a–23e, respectively. The junction defined by resistors 42 and 47 is selectively connected to ground by a lockout control switch 40. This control switch may be ganged with a VTR RECORD switch (not shown) so as to be closed when the VTR is operated in its recording mode.

A shunting transistor 53a–53e has its collector-emitter circuit connected between the junction defined by resistors 20a and 21a, 20b and 21b, 20c and 21c, 20d and 21d, and 20e and 21e, respectively, and ground. The bases of transistors 53a–53e are connected via resistors 52a–52e, respectively, to a charging capacitor 51. This charging capacitor is connected to source $+B_5$ via resistors 46 and 50. The junction defined by resistors 46 and 50 is coupled to ground via the collector-emitter circuit of a transistor 45 whose base is connected via a base resistor 44 to control switch 40.

Figure 2:
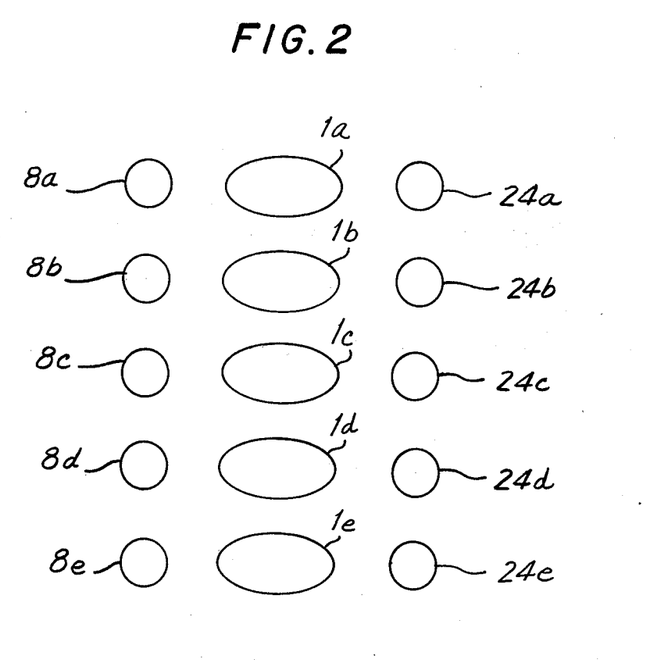
FIG. 2 depicts an arrangement of a channel selector which can be used with this invention, including channel selecting switches and channel indicators.

An operator's control panel may be provided with switches 1a–1e, light sources 8a–8e and light sources 24a–24e, respectively, as shown in FIG. 2. Distinctive colors might be used for the different sets of light sources so as to provide rapid indication of the particular channels to which the television receiver and the VTR are tuned. As an example, let it be assumed that switch 1a is the chanel 2 selector switch, and light sources 8a and 24a each are associated with a channel 2 indication. Let it be further assumed that lock-out control switch 40 is opened. Accordingly, in the absence of a channel selection, transistors 41 and 45 are conductive so as to reduce the voltages appearing at their respective collectors. Consequently, a relatively low voltage, approximately equal to ground potential, is applied from transistor 41 to each of light sources 24a–24e. Also, capacitor 51 is discharged to approximately ground potential via resistor 50 and conducting transistor 45.

Now, let it be assumed that switch 1a is closed. This applies ground potential to the corresponding input of memory circuit 1, resulting in a channel selector signal at memory circuit output terminal 1a'. This channel selector signal renders transistor 3a conductive so that current flows through its collector-emitter circuit. Hence, current flows from source $+B_2$ through light source 8a and transistor 3a, thereby energizing this light source to provide an indication that channel 2 has been selected. In addition, current flows from source $+B_1$ through resistor 4a and through transistor 3a. Hence, a voltage drop is provided across the tap of resistor 4a and ground, this voltage being less than operating voltage $+B_1$. Consequently, current flows through resistor 5a and diode 7a to reduce the voltage applied to the base of emitter-follower transistor 5. Accordingly, a corresponding voltage is supplied to variable reactance device 6 by the emitter-follower transistor to establish a respective reactance therein. This reactance, in turn, tunes the television receiver to channel 2.

At the same time, the channel selector signal at output terminal 1a' is applied through resistors 20a and 21a to transistor 22a, thereby rendering this transistor conductive. Hence, current flows from source $+B_4$ through resistor 27a and transistor 22a. It is recalled that, since lock-out control switch 40 is opened, a relatively low voltage is provided at the collector of transistor 41. Therefore, even though transistor 22a is conductive, the fact that a low voltage is provided at the collector of transistor 41 prevents current from flowing through light source 24a and transistor 23a. Therefore, transistor 23a is non-conductive.

The current flowing through resistor 27a generates a voltage at the output tap thereof. This voltage forward biases diode 28a, resulting in approximately the same voltage at the base of emitter-follower transistor 25. Consequently, the voltage which is supplied to variable reactance device 26 by this emitter-follower transistor tunes the VTR to channel 2.

At this time, none of the remaining output terminals 1b'–1e' is provided with a channel selector signal. Therefore, the remaining transistors 3b–3e and the remaining transistors 22b–22e all remain non-conductive.

If another one of switches 1b–1e is closed, the channel selector signal previously provided at output terminal 1a' terminates, and another channel selector signal is provided at the one output terminal which corresponds to the now-closed switch. When the channel selector signal at output terminal 1a' terminates, transistors 3a and 22a both are rendered non-conductive. This extinguishes light source 8a and, furthermore, changes the reactance of variable reactance devices 6 and 26, and thus changes the tuning condition of the television and VTR tuners. For example, if switch 1d is closed, the channel selector signal now is provided at output terminal 1d', thereby rendering transistors 3d and 22d conductive. Light source 8d is energized to provide an indication of the corresponding channel which has been selected, and the television and VTR tuners are suitably tuned, in accordance with the selected reactance of variable reactance devices 6 and 26, to the channel associated with switch 1d.

If switch 1e is closed, the channel selector signal which is provided at output terminal 1e' renders transistors 3e and 22e conductive. This reduces the collector voltages of these transistors, thereby forward biasing diodes 13 and 14, and forward biasing diodes 32 and 33. Consequently, video signals which are applied to emitter-follower transistors 11 and 30, as from an auxiliary video camera or playback circuit of another VTR, are transmitted through diodes 13 and 14, and through diodes 32 and 33, to the output terminals of the respective gate circuits. These video signals thus can be monitored as well as recorded, if desired.

Returning to the original example wherein it was assumed that switch 1a had been closed, thereby rendering transistors 3a and 22a conductive, let it be assumed that the program which is associated with this selected channel, for example, the program which is received via channel 2, is to be recorded. Lockout control switch 40 is closed, as by being ganged with, and thus operated by, a RECORD switch. When lock-out control switch 40 is closed, the voltages provided at the bases of transistors 41 and 45 are reduced so as to render these transistors non-conductive. Consequently, the collector voltage of transistor 41 now is increased so as to correspondingly increase the voltage applied to each of light sources 24a–24e. Since the channel selector signal is provided only at output terminal 1a', it is seen that only transistor 22a is conductive, while transistors 22b–22e all are non-conductive. Thus, now that transistors 41 is turned OFF, current flows from source $+B_3$ through resistor 43 and light source 24a to render transistor 23a conductive. When transistor 23a is conductive, the thyristor-connected transistor 22a and 23a both are "latched" to their conductive states. That is, since transistor 22a is conductive, it biases transistor 23a into conduction. Also, since transistor 23a is conductive, it biases transistor 22a into conduction. Therefore, even if the channel selector signal, which originally rendered transistor 22a conductive, is removed, transistors 22a and 23a remain latched in their conductive states. Thus, this thyristor connection of the transistors is seen to form a latching circuit.

Since transistors 22b–22e are non-conductive, transistors 23b–23e cannot be turned ON even when the relatively higher voltage provided at the collector of transistor 41 is supplied to their emitter circuits. Thus, only the latching circuit which included an already-conducting transistor, such as transistor 22a, will be latched when lock-out control switch 40 is closed. When the latching circuit formed of transistors 22a and 23a is latched into conduction, light source 24a is energized so as to provide a user with an optical indication that the VTR tuner is tuned to channel 2, which now is being recorded.

When lock-out control switch 40 is closed to turn OFF transistor 45, current flows from source $+B_5$ through resistors 46 and 50 to charge capacitor 51. This capacitor charges at a rate determined by the RC time constant of the charging circuit formed of resistors 46 and 50 and capacitor 51. Once capacitor 51 has been suitably charged, a relatively high voltage is supplied therefrom via resistors 52a–52e through transistors 53a–53e, respectively. Consequently, each of transistors 53a–53e is rendered conductive so as to shunt the respective conducting paths between output terminals 1a'–1e' and transistors 22a–22e to ground. That is, the junction defined by resistors 20a and 21a is shunted through transistor 53a to ground. Similarly, the junction defined by resistors 20b and 21b is shunted by transistor 53b to ground. The junctions defined by the remaining pairs of resistors likewise are shunted to ground. Nevertheless, even though the junction between resistors 20a and 21a is effectively short circuited, the latching circuit formed of transistors 22a and 23a remains latched in its conductive condition. This is because a voltage drop is provided across resistor 21a, which voltage drop is sufficient to maintain the conductivity of transistor 22a. Thus, the VTR tuner remains tuned to channel 2, as selected originally by closing switch 1a, and light source 24a remains energized to provide an indication that channel 2 has been selected for recording.

Now, let it be assumed that another switch, such as switch 1c, is closed. Accordingly, the channel selector signal previously provided at output terminal 1a' is terminated, and the channel selector signal now is provided at output terminal 1c'. As a consequence thereof, transistor 3a is turned OFF and transistor 3c is turned ON. Thus, emitter-follower transistor 5 is supplied with a voltage level corresponding to the selection of the channel associated with switch 1c. Also, light source 8a is extinguished and light source 8c is energized to provide a visual indication that this channel has been selected. The reactance of variable reactance device 6 is adjusted in accordance with the voltage level generated by the conduction of transistor 3c, and the television tuner now is tuned to the channel associated with switch 1c.

Since all of transistors 53a–53e are conducting, a channel selector signal provided at any of outputs 1a'–1e' will be shunted to ground. Therefore, except for the latching circuit which had been latched to its conductive condition, i.e., transistors 22a and 23a, none of transistors 22b–22e in the remaining latching circuits can be turned ON. Therefore, regardless of which switches 1a–1e is operated, only the latching circuit which had been latched to its conductive condition at the time that lock-out control switch 40 was closed will be conducting. This means that all of transistors 22b–22e remain non-conductive. Consequently, the voltage level which is provided at the base of emitter-follower transistor 25 remains fixed in accordance with the latched condition of the latching circuit formed of transistors 22a and 23a. Therefore, the reactance of variable reactance device 26 remains constant, even though any one of switches 1a–1e may be operated, so as to maintain the VTR tuner locked onto channel 2. This is indicated by energized light source 24a.

The previously latched latching circuit will be "unlatched" to its non-conductive condition only when lock-out control switch 40 is opened. When this occurs, transistor 41 is turned ON to reduce its collector voltage. Thus, current no longer flows from the collector of this transistor through light source 24a and the conductive latching circuit formed of transistors 22a and 23a. Accordingly, transistor 23a is rendered non-conductive so as to turn OFF transistor 22a. This removes the distinct voltage level from the base of emitter-follower transistor 25 and, furthermore, extinguishes light source 24a. The VTR tuner thus no longer is tuned to channel 2.

In addition, when lock-out control switch 40 is closed, transistor 45 is rendered conductive so as to discharge capacitor 51. Consequently, the voltage across this capacitor is reduced so as to render shunting transistor 53a–53e non-conductive. The signal paths between output terminals 1a'–1e' and transistors 22a–22e, respectively, no longer are short-circuited. Therefore, when any one of switches 1a–1e is closed, a channel selector signal is provided at the corresponding output terminal 1a'–1e' to render a respective one of transistors 22a–22e conductive.

Thus, it is seen that, in accordance with the arrangement shown in FIG. 1, a user can select any channel, as desired, for viewing on the television receiver, in accordance with the particular switch 1a–1e which is closed. If the VTR is not yet operated for recording, the VTR tuner likewise is tuned to the selected channel. If the user decides to record the television program which he now is viewing, the VTR RECORD switch is closed, and this also closes lock-out control switch 40. Once switch 40 is closed, the light source 24a–24e associated with the selected channel is energized to provide a visual indication that this selected channel is being recorded. At a delayed time following the closing of switch 40, which delayed time is determined by the RC time constant of the charging circuit formed of resistors 46 and 50 and capacitor 51, the latching circuits formed of transistors 22a–23a, 22b–23b, . . . 22e–23e are inhibited from responding to further operations of the channel selector switches. Nevertheless, the one latching circuit which is associated with the channel that is being recorded is latched to its conductive condition so as to maintain the correct reactance of variable reactance device 26. Thus, the VTR tuner remains tuned to the channel coresponding to the latched latching circuit. However, even though the VTR tuner remains locked to the particular channel which is being recorded, operation of the channel selector switches will enable the user to change the tuning condition of the television tuner, and thus view television programs which are received via different channels. It may be appreciated that, in accordance with the illustrated arrangement, there is virtually no possibility of unintentionally changing the channel to which the VTR tuner is tuned. In order to change the tuning condition of the VTR in a recording mode, it is necessary to open lock-out control switch 40.

While the present invention has been particularly shown and described with respect to a preferred embodiment, it should be readily apparent to those of ordinary skill in the art that various changes and modifications in form and details can be made without departing from the spirit and scope of the invention. For example, the respective tuners may be provided in a radio receiver and in an audio recorder, respectively. These tuners also may be provided in virtually any type of device which is capable of receiving information transmitted thereto via different channels. Thus, while one channel is being monitored, any other channel may be received. Also, light sources 8a–8e and 24a–24e may be any suitable light sources, such as neon tubes, LED's, and the like. Such light sources alternatively may comprise light transmitting devices, such as LCD's. Furthermore, additional light sources may be provided in series with resistors 27a–27d and with resistor 36 so as to provide an indication of the channel to which the VTR tuner is tuned, separate and apart from the indication of the channel to which the television receiver is tuned, even if the VTR is not yet operated in its recording mode. In accordance with another embodiment, the thyristor-connected transistors in each latching circuit can be replaced by an SCR which is additionally connected to a switching transistor in series with the adjustable resistor. In accordance with yet another embodiment, shunting transistors 53a-53e may be replaced by transistors whose collector-emitter circuits are connected in series with the conducting paths extending between output terminals 1a'-1e' and the illustrated latching circuits. Such transistors would be rendered non-conductive when lock-out control switch 40 is closed. Still further, the time constant of the charging circuit formed of resistors 46 and 50 and capacitor 51 may be selected as desired. In the foregoing embodiment, the time constant is assumed to be long enough to permit a latching circuit to latch prior to rendering the shunting transistors conductive. Still further, the reactance of variable reactance devices 6 and 26 has been described as being established by analog circuits. If desired, the reactance can be determined by digital control techniques, such as described in copending application Ser. No. 716,702, filed Aug. 23, 1976 now U.S. Pat. No. 4,085,372. The teachings of the present invention can be utilized with such digital techniques.

It is intended that the appended claims be interpreted as including the foregoing as well as all other similar changes and modifications.

What is claimed is:

1. Channel selecting apparatus for use with first and second electrically tunable tuning devices, said channel selecting apparatus being operable to tune said tuning devices to preselected channels for receiving broadcast frequencies and comprising:

selectively operable channel selecting means common to said first and second tuning devices for generating and supplying channel selector signals to said first and second tuning devices to determine the tuning condition of both said tuning devices;

control means for selectively producing a lock-out control signal; and locking means coupled to said second tuning device and responsive to the absence of said lock-out control signal to enable the tuning condition of said second tuning device to be determined by said channel selector signals simultaneously with the determination of the tuning condition of said first tuning device; said locking means being responsive to the presence of said lock-out control signal to lock said second tuning device to the tuning condition determined by the channel selector signal generated immediately prior to the producing of said lock-out control signal, regardless of the generation of different channel selector signals by said channel selecting means.

2. The apparatus of claim 1 wherein said second tuning device includes plural switch means responsive to said channel selector signals for producing predetermined levels representing said preselected channels, and variable reactance means coupled to said plural switch means having a reactance controlled by said predetermined levels for tuning said second tuning device to corresponding channels; and wherein said locking means includes means for inhibiting said switch means from responding to a channel selector signal when said lock-out control signal is produced.

3. The apparatus of claim 2 wherein each of said switch means comprises a latching circuit selectively exhibiting first and second conditions, said latching circuit assuming its first condition to produce a predetermined level in response to a channel selector signal in the absence of said lock-out control signal, and said latching circuit being inhibited by said means for inhibiting from changing its condition.

4. The apparatus of claim 3 further comprising channel selection indicating means coupled to said latching circuits for indicating which of said latching circuits exhibits said first condition and thereby indicating the selected channel.

5. The apparatus of claim 4 further comprising a respective conducting path coupled between said channel selecting means and each of said latching circuits; and wherein said means for inhibiting comprises shunt means coupled to said respective conducting paths and energized in response to said lock-out control signal for shunting said respective conducting paths to a reference level, whereby channel selector signals are prevented from being transmitted to said latching circuits over said conducting paths.

6. Channel selecting apparatus for use with first and second electrically tunable tuning devices, each tuning device including variable reactance means having a reactance controlled by a voltage applied thereto for tuning said tuning device to a preselected channel, said channel selecting apparatus being operable to tune said tuning devices to preselected channels for receiving incoming signals and comprising:

selectively operable channel selecting means having plural outputs corresponding to said preselected channels for providing, when operated, a channel selector signal at a selected output representing one of said preselected channels;

control means for selectively producing a lock-out signal;

a set of latching circuits included in said second electrically tunable tuning device, each latching circuit being coupled to a respective output of said channel selecting means for receiving a channel selector signal to assume a conductive condition in response thereto, said conductive condition of said latching circuit terminating when the channel selector signal received thereby terminates;

voltage generating means responsive to the conductivity of a respective latching circuit for supplying a corresponding voltage to the variable reactance means included in said second tuning device to determine the reactance thereof and thereby establish the tuning condition of said second tuning device;

latch control means responsive to said lock-out signal for latching the respective latching circuit which receives a channel selector signal to maintain its conductive condition; and switch means responsive to said lock-out signal for preventing all of said latching circuits from receiving channel selector signals.

7. The apparatus of claim 6 further comprising a channel indicator coupled to each of said latching circuits and responsive to said lock-out signal to indicate if the latching circuit coupled thereto is latched in its conductive condition, thereby providing an indication of the channel to which said second tuning device is tuned.

8. The apparatus of claim 7 wherein each of said latching circuits comprises first and second transistors connected for thyristor operation, said first transistor being rendered conductive in response to a channel selector signal and said second transistor being rendered conductive in response to said lock-out signal if said first transistor is conductive to latch said first transistor to maintain conduction even if said channel selector signal terminates.

9. The apparatus of claim 8 wherein said channel indicator is connected in series with said second transistor to provide a channel indication when said second transistor is conductive.

10. The apparatus of claim 9 wherein each of said first transistors is coupled to an output of said channel selecting means by a conducting path; and wherein said switch means comprises plural shunting transistors, each coupled to a respective conducting path and energizing in response to said lock-out signal to shunt said respective conducting path to a reference potential.

11. The apparatus of claim 10 wherein said latch control means comprises a switching transistor biased in the absence of said lock-out signal to prevent current from flowing to all of said channel indicators and latching circuits, and biased in response to said lock-out signal to supply current to said channel indicators and latching circuits to enable the latching circuit having a conductive first transistor to latch and for current to flow through the channel indicator connected to said latched latching circuit.

12. The apparatus of claim 11 wherein said switch means further comprises a charging circuit de-energized in the absence of said lock-out signal and energized in response to said lock-out signal to produce a shunt signal at a delayed time following said lock-out signal, said charging circuit being coupled to all of said shunting transistors to supply said shunt signal thereto for energizing said shunting transistors.

13. The apparatus of claim 12 wherein each of said conducting paths includes series-connected resistors, and each of said shunting transistors is coupled between a respective junction formed by two series-connected resistors and ground.

14. The apparatus of claim 13 wherein said voltage generating means comprises a plurality of adjustable resistors, each being connected in series with a respective first transistor in a latching circuit for current to flow therethrough when said first transistor is conductive, and each being adjusted to produce a predetermined voltage when current flows therethrough.

15. The apparatus of claim 8 wherein said first tuning device includes a set of transistors, each transistor in said set being coupled to a respective output of said channel selecting means for receiving a channel selector signal to assume a conductive condition in response thereto, the conductivity of said transistor terminating when the channel selector signal received thereby terminates; a plurality of adjustable resistors, each being connected in series with a respective transistor in said set for current to flow therethrough when said respective transistor is conductive; and each being adjusted to produce a predetermined voltage when current flows therethrough; means for supplying the voltage produced by each adjustable resistor to the variable reactance means included in said first tuning device; and a channel indicator connected in series with a respective transistor in said set for current to flow therethrough when said respective transistor is conductive and thereby provide an indication of the channel to which said first tuning device is tuned.

* * * * *